(12) United States Patent
Zinn

(10) Patent No.: US 7,376,543 B2
(45) Date of Patent: May 20, 2008

(54) SIMULATION METHOD AND SYSTEM FOR DESIGN OF APERTURE IN EXPOSURE APPARATUS AND RECORDING MEDIUM IN WHICH THE SIMULATION METHOD IS RECORDED

(75) Inventor: Shun-Yong Zinn, Greenbelt, MD (US)

(73) Assignee: Samsung Electronics Co., Ltd., Suwon, Kyungki-Do (KR)

(*) Notice: Subject to any disclaimer, the term of this patent is extended or adjusted under 35 U.S.C. 154(b) by 679 days.

(21) Appl. No.: 10/418,220

(22) Filed: Apr. 18, 2003

(65) Prior Publication Data

US 2003/0236653 A1 Dec. 25, 2003

(30) Foreign Application Priority Data

Jun. 22, 2002 (KR) .................. 10-2002-0035173

(51) Int. Cl.
G06G 7/62 (2006.01)
(52) U.S. Cl. ......................................................... 703/13
(58) Field of Classification Search .................... 703/13
See application file for complete search history.

(56) References Cited

U.S. PATENT DOCUMENTS

| 5,680,588 | A | * | 10/1997 | Gortych et al. | 716/19 |
| 6,249,597 | B1 | * | 6/2001 | Tsudaka | 382/144 |
| 6,577,379 | B1 | * | 6/2003 | Boettiger et al. | 355/52 |
| 6,760,892 | B2 | * | 7/2004 | Taoka et al. | 716/4 |
| 6,797,527 | B2 | * | 9/2004 | Kikuchi | 438/14 |

FOREIGN PATENT DOCUMENTS

| JP | 14-072442 | 3/2002 |
| KR | 1999-76548 | 10/1999 |

OTHER PUBLICATIONS

Geert Vandenbergh et al., "ArF Lithography Options for 100nm Technologies",Semiconductor Fabtech—14th Edition, pp. 157-165.
F.M. Schellenberg et al., "Adoption of OPC and the Impact on Design and Layout", Design Automation Conference, Session 7-4, Jun. 19, 2001.
Geert Vandenbergh et al., "ArF Lithography Options for 100nm Technologies", Semiconductor Fabtech - 14th Edition, pp. 157-165. Feb. 2, 2005.
F.M. Schellenberg et al., "Adoption of OPC and the Impact on Design and Layout", Design Automation Conference, Session 7-4, Jun. 19, 2001.

* cited by examiner

*Primary Examiner*—Paul Rodriguez
*Assistant Examiner*—Juan Ochoa
(74) *Attorney, Agent, or Firm*—Volentine & Whitt, PLLC.

(57) ABSTRACT

A simulation method designs an aperture to obtain optimum resolution and DOF in consideration of the layout of a circuit pattern of a photomask, and a recording medium in which the simulation method is recorded. The simulation method for designing an aperture in an exposure apparatus including a light source, an optical lens group, a photomask, an aperture, receives the layout information of the photomask. The aperture is divided into a plurality of pixels. The pixels of the aperture are flipped, a photolithography simulation is executed to produce a simulated photoresist pattern, and the shape of the aperture that provides an optimum resolution for the simulated photoresist pattern is searched for. Beneficially, a system is provided to execute the method. Also, beneficially, the simulation method may be stored on a storage medium.

12 Claims, 5 Drawing Sheets

SIMULATION METHOD AND SYSTEM FOR DESIGN OF APERTURE IN EXPOSURE APPARATUS AND RECORDING MEDIUM IN WHICH THE SIMULATION METHOD IS RECORDED

CROSS REFERENCES TO RELATED APPLICATIONS

This application claims priority under 35 U.S.C. §119 from Korean Patent Application No. 2002-35173, filed on Jun. 22, 2002, the contents of which are hereby incorporated by reference in their entirety as if fully set forth herein.

BACKGROUND AND SUMMARY

1. Technical Field

The present invention relates to a photolithography system, and more particularly, to a simulation method and system for designing an aperture in an exposure apparatus and a recording medium on which the simulation method is recorded.

1. Description

Photolithography is a process of forming a circuit pattern on a semiconductor wafer and includes a series of processes such as photoresist coating, exposure, and development. As the integration of semiconductor devices increases, various technologies related to photolithography continue to develop in order to obtain a high resolution and optimum depth of focus (DOF) of a photolithography pattern.

Figure 1:
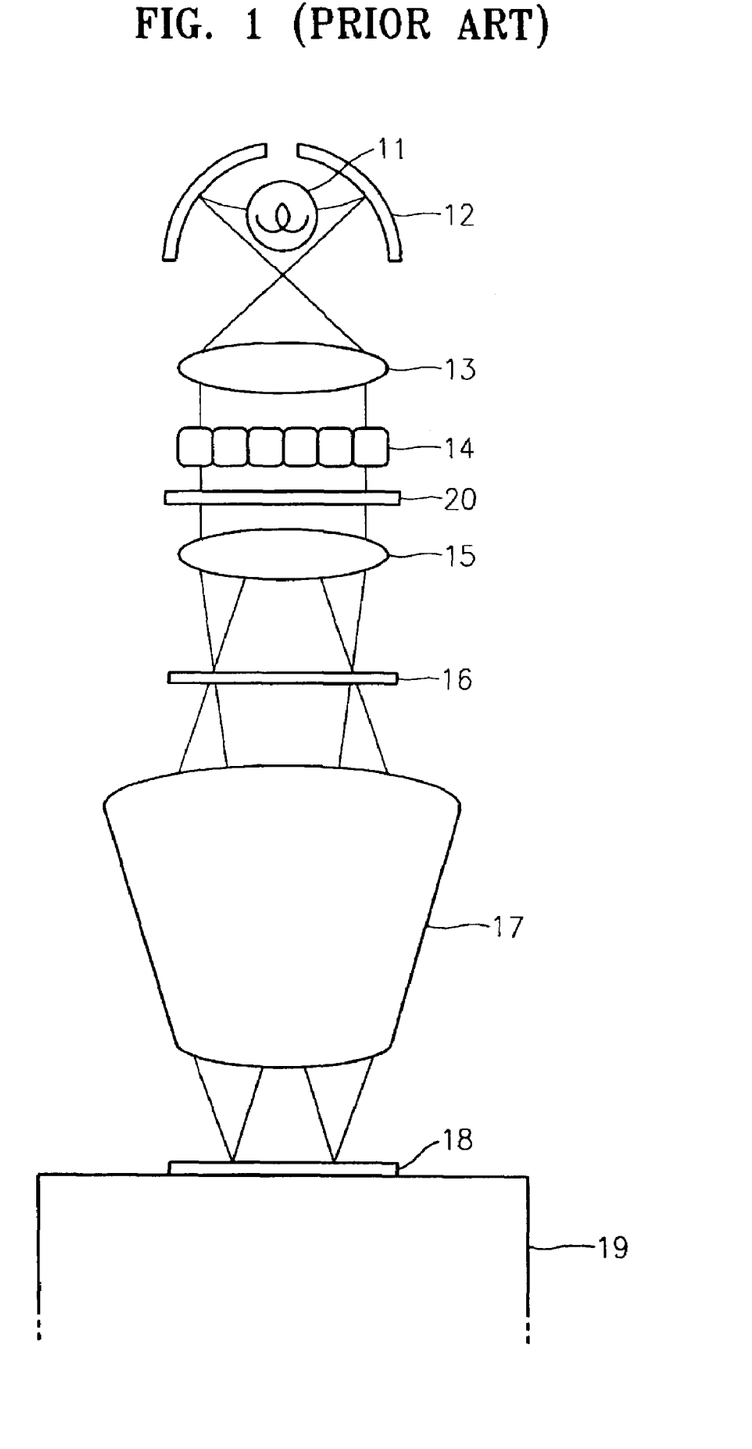
FIG. 1 is a cross-sectional view of a projection exposure apparatus.

FIG. 1 illustrates a conventional projection exposure apparatus in which photolithography is performed. Referring to FIG. 1, for example, a pair of oval-shaped mirrors 12 are placed around a light source 11, and a collector lens 13, a fly-eye lens 14, a condenser lens 15, a photomask 16, a projection lens 17, a wafer 18, and a wafer table 19 are sequentially arranged under the light source 11. In this case, an aperture 20 which determines the direction of light, is placed between the fly-eye lens 14 and the condenser lens 15. An aperture 20 having a circular opening in the center is usually used. However, if an off-axis illumination (OAI) method is introduced, an aperture having an annular, quadropole, or quasar shaped opening is used.

The operation of the projection exposure apparatus is described below. Light emitted from the light source 11 is reflected by the oval-shaped mirror 12 and is then condensed by the collector lens 13. Light travels parallel to an optical axis through the collector lens 13 and then through the fly-eye lens 14. Light which passes through the fly-eye lens 14, passes through the aperture 20 and is condensed by the condenser lens 15. In this case, the aperture 20 has a predetermined opening as described above, and can adjust the direction of light, i.e., angle, to be transmitted to the photomask 16. Light which passes through the condenser lens 15 is transmitted to the photomask 16, which is used to form a predetermined circuit pattern. After that, light passes through the photomask 16 and the projection lens 17 and is focused on the wafer 18. As a result, the circuit pattern is projected onto the surface of the wafer 18, which is placed on the wafer table 19.

In order to obtain optimum resolution and DOF in a photolithography pattern, it is important for light to be projected in consideration of the layout of the circuit pattern of the photomask 16, and the traveling direction of light can be controlled by the aperture 20.

However, in the present integration circuit manufacturing process, at least 20 to 30 photomasks having different circuit patterns are necessary to manufacture just one device. On the other hand, only a few of the apertures 20 that are mounted in a projection exposure apparatus are used to manufacture one device. Hence, optimum resolution and DOF for each of the photomasks having the layouts of various circuit patterns cannot be obtained. Further, it is not easy to design an aperture in which optimum resolution and DOF are obtained for the layout of each of the photomasks.

To solve the above problems, it would be desirable to provide a simulation method in which an aperture is designed to obtain an optimum resolution and DOF in a photolithography pattern, taking into consideration of the layout of a circuit pattern of a photomask.

It would also be desirable to provide a simulation system implemented by the simulation method.

It would further be desirable to provide a recording medium in which the simulation method is recorded.

Accordingly, according to one aspect of the present invention, there is provided a simulation method for designing an aperture in an exposure apparatus including a light source, an optical lens group, a photomask, and an aperture.

In the method, first, the layout information of the photomask is received. Next, the aperture is divided into a plurality of pixels. Then, the pixels of the aperture are flipped, a photolithography simulation is executed to produce a simulated photolithography pattern, and the shape of the aperture that produces an optimum resolution for the simulated photolithography pattern is searched for.

More specifically, first, exposure conditions and an image of a photomask are inputted into a simulation program. Next, the simulation of a photolithography process is executed using the exposure conditions and the image of the photomask as data. Subsequently, the aperture is divided into a plurality of pixels and the pixels of the aperture are flipped. The simulation of the photolithography process is repeatedly executed when the pixels of the aperture are flipped, and a cost function value, which is a difference between the layout of the photomask and a simulated photoresist pattern produced by the simulation step, is calculated. After that, the steps of flipping the pixels of the aperture, executing the simulation of the photolithography process, and calculating a cost function value are repeatedly performed until the cost function is uniform.

As used herein, the term "flipping the pixels of the aperture" means that the pixels of the aperture are varied so that one or more of the closed pixels are opened and/or one or more of the open pixels are closed.

The exposure conditions include the wavelength of a light source in the exposure apparatus, the intensity of a light source, a numerical aperture (NA) value, and the shape of an aperture.

According to another aspect of the present invention, there is provided a simulation system for designing an aperture in an exposure apparatus. The system includes: an inputting unit adapted to receive input data, including the layout information of a photomask; a simulation executing unit which uses the input data to produce a simulated photolithography pattern and searches for the shape of an aperture providing an optimum resolution of the simulated photolithography pattern; and a display unit which displays the result of the simulation executing unit.

In this case, the input data may include exposure conditions such as numerical aperture values, the shapes of apertures, and/or the types and wavelength of light sources.

In addition, the simulation executing unit includes: a photolithography simulation unit which uses the input data to perform a simulated photolithography process; an aperture flipping unit which divides the aperture into a plurality of pixels and flips the pixels of the aperture in a stepwise manner; a cost calculating unit which calculates a cost function value, which is a difference between a photoresist pattern formed by the photolithography simulation unit and the layout of a photomask; and a cost comparing unit which determines whether or not the calculated cost function is uniform. In addition, the display unit may include a monitor.

In order to achieve the above objectives, according to another aspect of the present invention, there is provided a computer readable storage in which is stored a program for executing a method of designing an aperture in an exposure apparatus. The program includes an inputting module adapted to receive input data including the layout information of a photomask; a simulation module adapted to use the input data to perform a photolithography simulation process to produce a simulated photoresist pattern and to search for a shape of an aperture providing an optimum resolution for the simulated photoresist pattern; and a display module which controls a display of a result of the simulation module.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete and will fully convey the scope of the invention to those skilled in the art. In the drawings, the forms of elements are exaggerated for clarity. Like reference numerals refer to like elements throughout the drawings.

Figure 2:
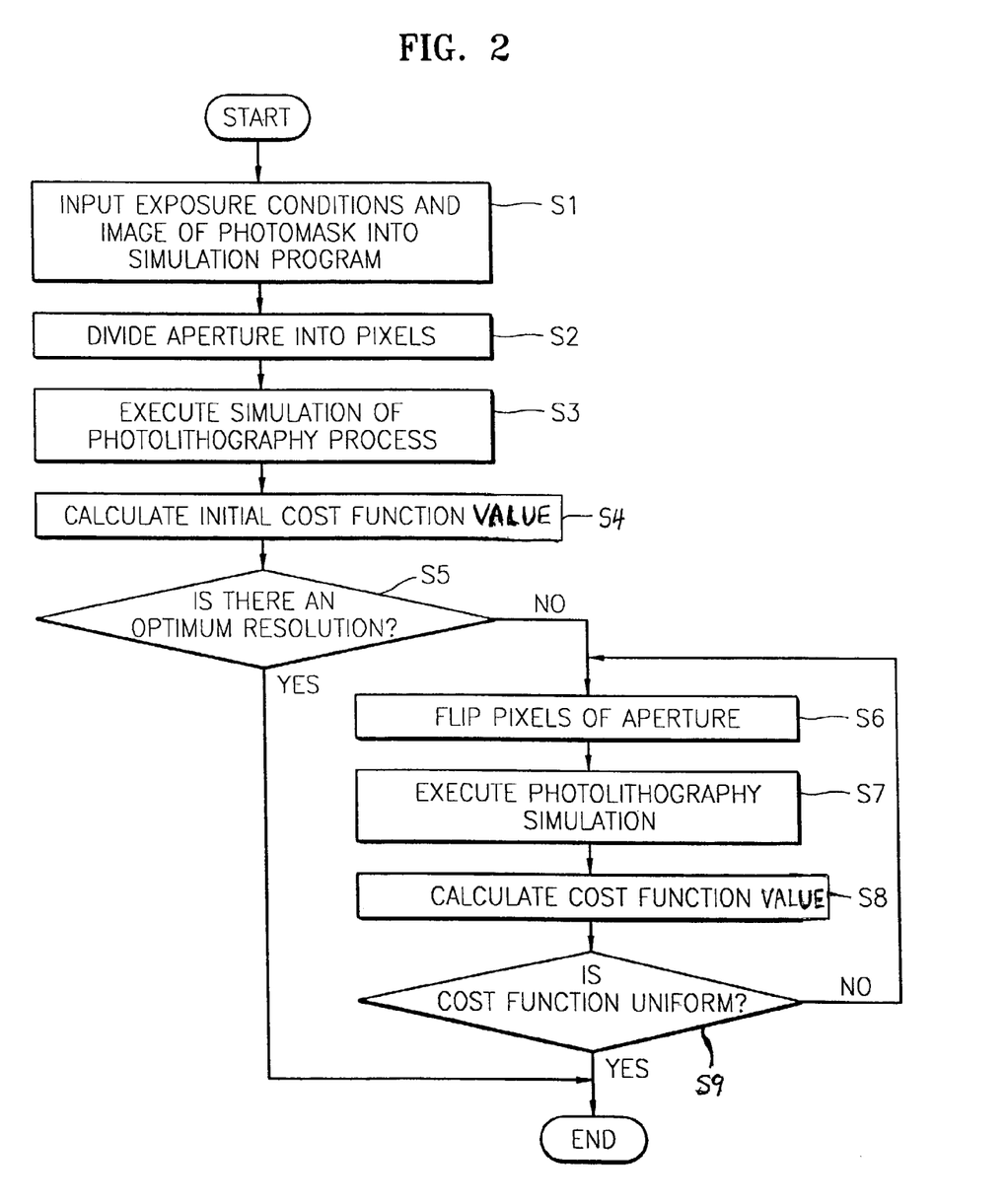
FIG. 2 is a flow chart illustrating one embodiment of an aperture simulation method.
Figure 3A:
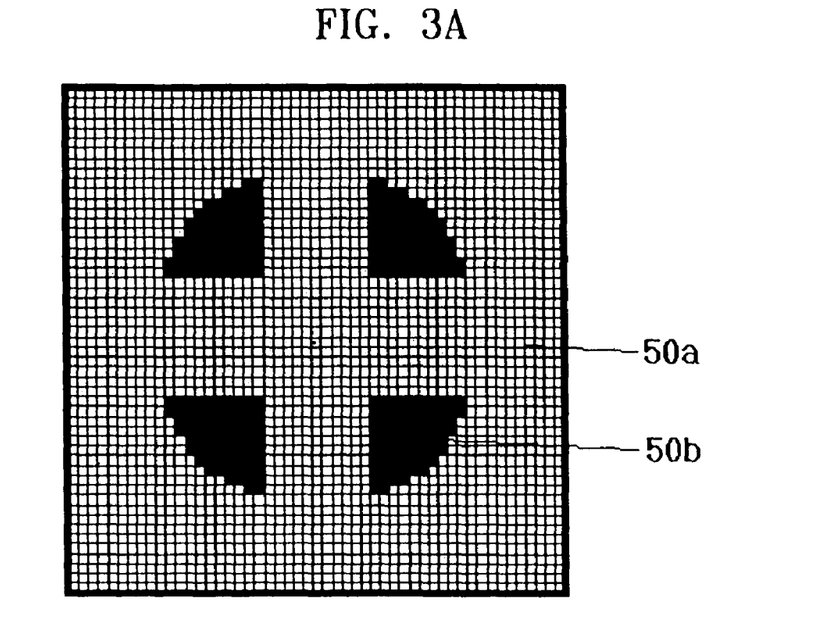
FIGS. 3A and 3B are plan views illustrating apertures divided into pixels.
Figure 3B:
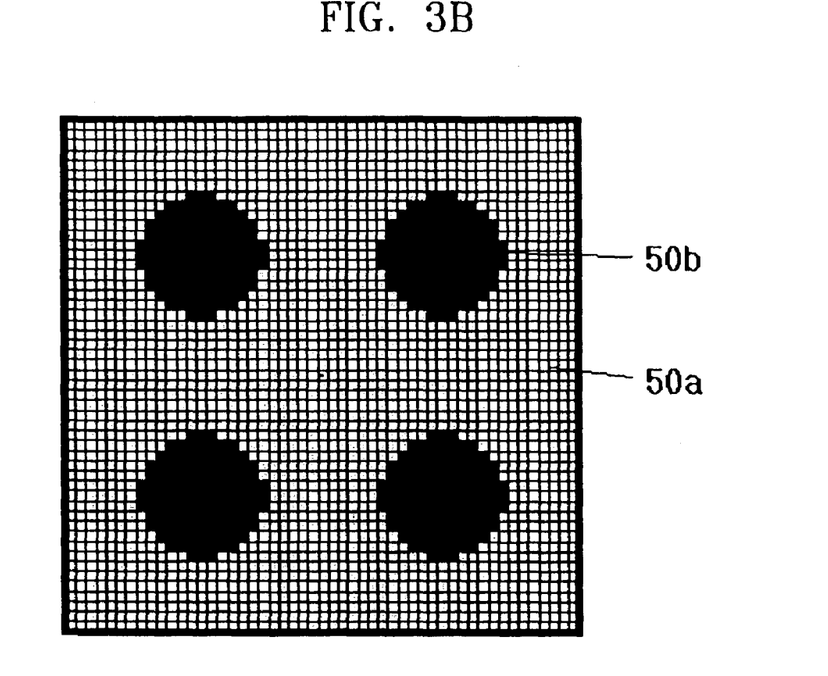

FIG. 2 is a flow chart illustrating an aperture simulation method and FIGS. 3A and 3B are plan views illustrating apertures divided into pixels.

As the integration level of photomasks increases, a photolithography simulation program is employed. The photolithography simulation program is a program for realizing a photolithography process in the virtual space of a computer before an actual manufacturing, step so as to optimize the conditions of a photolithography process.

Here, a photolithography simulation program is used as an aperture simulation program. Beneficially, an optical lithography simulator called "TOPO" is used. The computer may be a personal computer (PC) for performing a simulation program and may include a central processing unit (CPU), an inputting unit, random access memory (RAM), a memory unit, a transmission controller, and a display unit, which are all typical elements of a PC.

Hereinafter, a simulation method for designing an aperture will be described with reference to FIG. 2.

In step S1, exposure conditions and the image of a photomask are inputted into the photolithography simulation program. For example, the exposure conditions may be the wavelength of a light source of an exposure apparatus (see FIG. 1), the intensity of a light source, a numerical aperture (NA) value, and the shape of an opening of an aperture. The image of the photomask, i.e., the layout of a circuit pattern arranged on the surface of the photomask, may be inputted using a scanning apparatus.

In step S2, an aperture 50 having an opening of a predetermined shape, i.e., annular, quasar, or quadropole shape, is divided into a number of pixels having a certain size. That is, the aperture 50 is divided into a number m of pixels in a horizontal direction and a number n of pixels in a vertical direction, and thus the entire aperture 50 is divided into m×n of pixels. Here, FIG. 3A illustrates a quasar-shaped aperture divided into a number of pixels, and FIG. 3B illustrates a quadropole-shaped aperture divided into a number of pixels. In FIGS. 3A and 3B, the apertures are divided into pixels in a virtual simulation program. Further, the finer the pixels, the higher the resolution and DOP. Here, reference numerals 50a and 50b denote a light blocking region and a light transmitting region, respectively.

In step S3, a simulation of the photolithography process is executed using the inputted exposure conditions, the layout of the photomask, and an initial aperture image. Then, the simulation program summarizes information such as the exposure conditions, the layout of the photomask, and the aperture image, and predicts and displays a photoresist pattern that would be implemented on a wafer.

In step S4, a simulated, or virtual, photoresist pattern obtained in step S3 is compared with the circuit pattern of the photomask, and an initial difference in area or volume is measured. In this comparison, the area or volume of space in which the virtual photoresist pattern deviates from the circuit pattern of the photomask is defined by a cost function. In this case, it can be understood that as a value of the cost function becomes smaller, it indicates that a photoresist pattern is formed on the wafer that is closer to the circuit pattern of the photomask. The cost function value is calculated by a general computer program.

In step S5, it is checked whether or not the virtual photoresist pattern formed in step S3 has an optimum resolution with respect to the cost function. When a general aperture is used, if a desired resolution is obtained, that is, if a desired cost function value is calculated, simulation is stopped. However, the general aperture is designed to obtain the average resolution of several photomasks, and thus the optimum resolution and DOF for a predetermined photomask cannot be obtained.

In step S6, if the photoresist pattern formed on the wafer does not have the desired resolution, one or more pixels of the aperture are flipped. Here, flipping the pixels of the aperture means that the pixels of the aperture are sequentially varied so that closed pixels are opened and open pixels are closed. That is, the open and closed spaces of the aperture are varied in a stepwise manner.

In step S7, the photolithography simulation is executed repeatedly when the open and closed spaces of the aperture are varied. Subsequently, in step S8, a new cost function value is calculated so as to check the degree to which the resolution of the photoresist pattern formed through the photolithography simulation step (step S7) has improved.

In step S9, the calculated cost function value is compared with the previous cost function value, and it is determined whether or not the calculated cost function is uniform. That is, the previously calculated cost function value is compared with the cost function value calculated in the present step S8, and it is determined if they are the same, within a selected, acceptable margin of error. In this case, if the two cost function values are almost the same (i.e., within the error margin), then the simulation step is terminated. If the two cost function values are within the error margin of each other (not almost the same), then aperture pixels are flipped again (step S6), the photolithography simulation is executed again (step S7), the cost function is recalculated (step S8), and the recalculated cost function is compared with the previous cost function to again determine whether the cost function is uniform (step S9). Here, steps S6, S7, S8, and S9 are repeatedly performed until the cost function is determined to be uniform.

The first time through the steps, the cost function value of step S4 is compared with the cost function value of step S8. In this case, when the desired resolution is not obtained, the method returns to the step of flipping the aperture pixels (step S6). After flipping the aperture pixels, the previous cost function value (cost function value calculated before step S8) is compared with the present cost function and the steps are repeated.

Beneficially, a simulated annealing algorithm is used to minimize the cost function.

Likewise, in order to obtain an optimum resolution and DOF, the optimum aperture shape which corresponds to images of each of the photomasks can be designed.

Figure 4A:
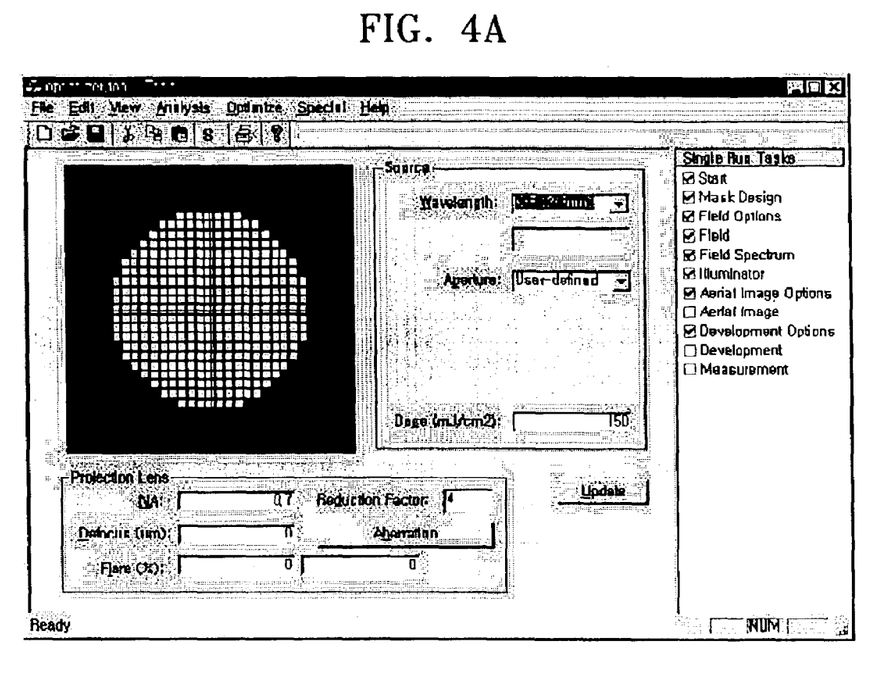
FIGS. 4A and 4B illustrates a simulation screen before aperture simulation, and a screen illustrating the result of aperture simulation, respectively.
Figure 4B:
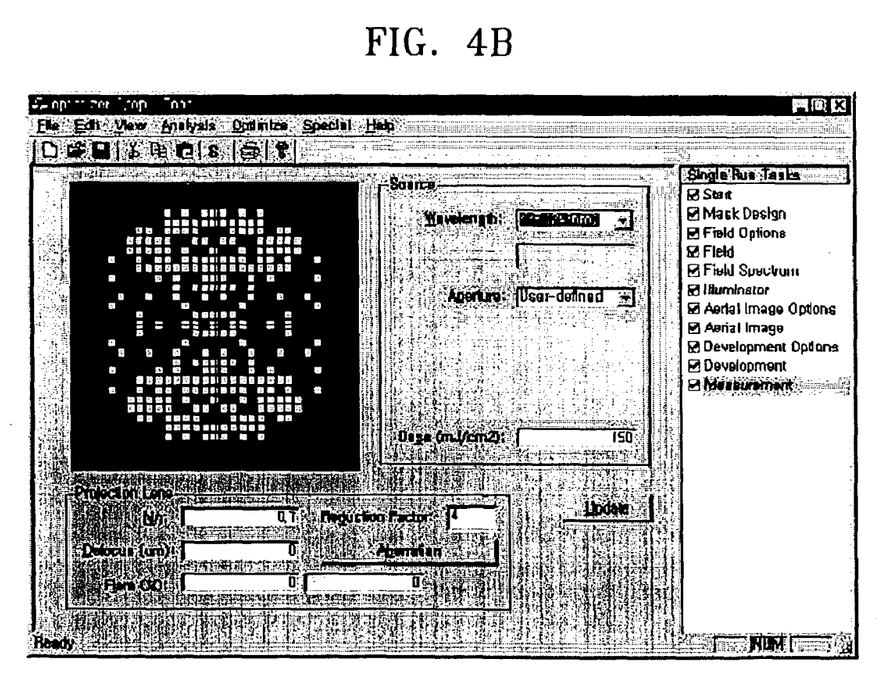

FIGS. 4A and 4B illustrate a simulation screen before aperture simulation, and a screen illustrating the result of aperture simulation, respectively. In the present example, the simulation of an aperture shape for a photomask, which defines a storage node electrode, is executed. In this case, for example, a quasar-shaped aperture is used. In this case, the image contrast of each of the photoresist patterns which defines a storage node electrode is calculated to be 0.46 in a minor axis direction and 0.27 in a major axis direction. An image log slope is also calculated to be 10.7/µm in the minor axis direction and 3.12/µm in the major axis direction. Comparing the data for the minor and major axis directions, the photoresist pattern wasn't formed in a desired form along the major axis direction as compared to the photoresist pattern along the minor axis direction. As a result, the desired optimum resolution cannot be obtained.

As shown in FIG. 4A, numerical aperture values (NAs), the shapes of apertures, and the types of light sources are inputted to the simulation program. In the specific example of FIG. 4A, the numeral aperture (NA) is 0.7, a circular aperture is used, and a KrF light source having the wavelength of 248 nm is used. Further, the image of a photomask which defines a storage node electrode is inputted to the simulation program. Next, the circular aperture is divided into a plurality of pixels by a computer.

The photolithography simulation is executed using the exposure conditions and the shape of the photomask. Then, a photoresist pattern to be formed on the wafer is shown on a monitor of the computer, and the image contrast and image log slope of the photoresist pattern, which are used to determine a cost function and resolution, are calculated by the simulation program.

As a result, the pixels of the aperture are flipped continuously until the cost function is maintained at a uniform value. More specifically, the pixels of the aperture are opened and closed sequentially, the photolithography process is performed, and the cost function value is calculated. When the cost function cannot be reduced any more, that is, when the cost function value calculated in the previous step is similar to the cost function value calculated in the present step, within an acceptable error margin, simulation stops.

FIG. 4B illustrates a simulation screen which represents the shape of a final aperture when the cost function cannot be reduced any more. When the aperture for the photomask which defines the storage node electrode has a 90 degree-rotated butterfly/necktie-shaped opening, a photoresist pattern having a shape most similar to that of the circuit pattern of the photomask is formed.

When the photolithography simulation is executed using the aperture having the above shape, the image contrast of the photoresist pattern is measured to be 0.47 in the minor axis direction and 0.33 in the major axis direction. This shows that the image contrast of the aperture having the above shape is increased by 2% in the minor axis direction and by about 22% in the major axis direction, compared to the case where a quasar-shaped aperture is used. The image log slope of the photoresist pattern in the minor axis direction is 10.81/µm, and so there is no great variation compared to before. On the other hand, the image log slope of the photoresist pattern in the major axis direction is 4.51/µm, an increase of about 40%. Here, the image contrast and the image log slope of the photomask pattern are elements used to determine the resolution and DOF, and as the elements become larger, resolution and DOF are improved.

In this way, using the photolithography simulation method, the aperture can be designed for which an optimum resolution and DOP for each of the photomasks are obtained.

Figure 5:
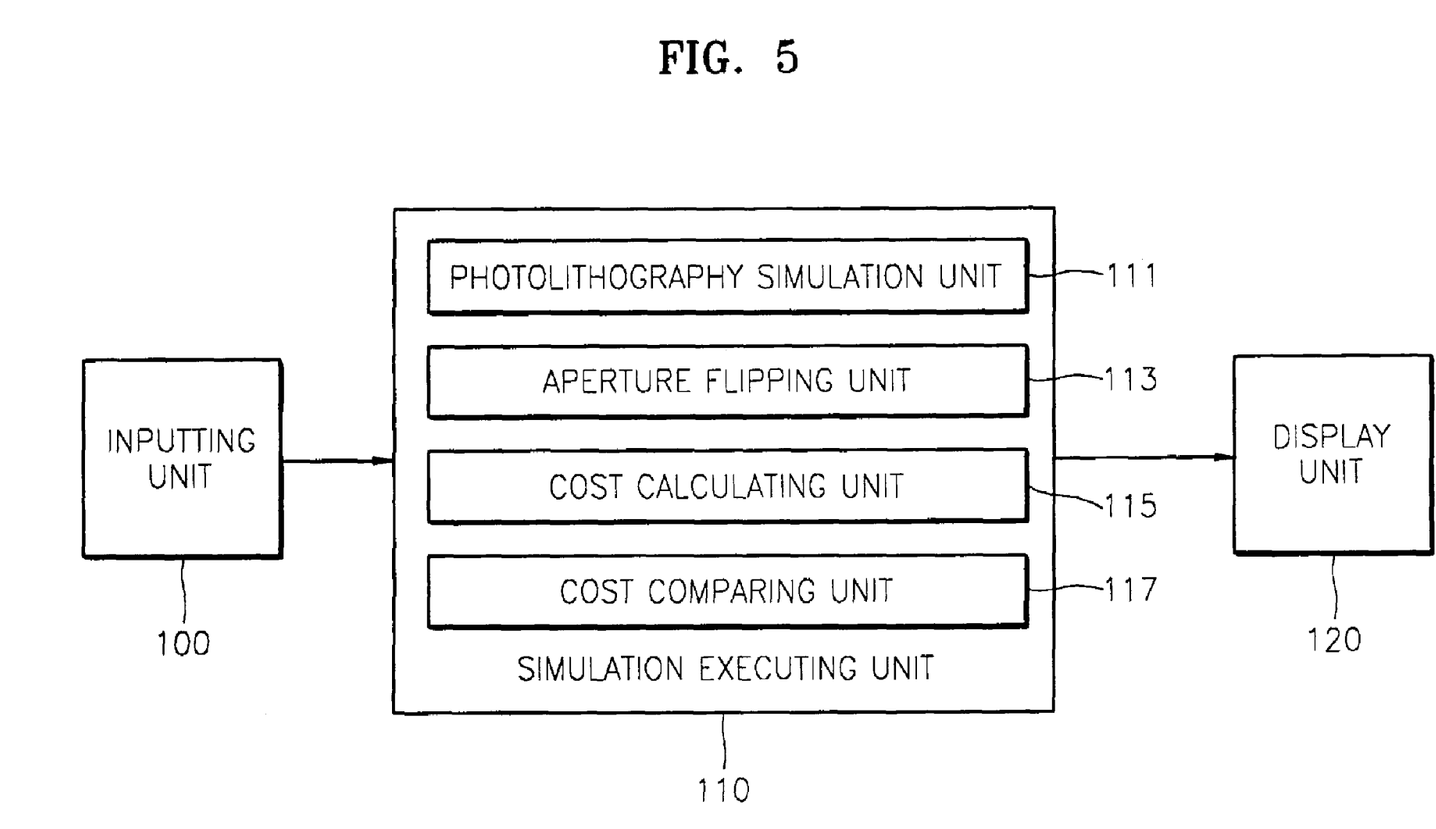
FIG. 5 is a block diagram of a simulation system for designing an aperture.

FIG. 5 is a block diagram of a simulation system for designing an aperture. As shown in FIG. 5, the simulation system for designing an aperture includes an inputting unit 100, a simulation executing unit 110, and a display unit 120.

Information on exposure conditions in an exposure apparatus, such as numerical aperture values (NAs), the shapes of apertures, the types of light sources, and the layouts of photomasks, are inputted to the inputting unit 100, and the inputting unit 100 transmits the information to the simulation executing portion 110. In this case, the inputting unit 100 may include a scanning unit (not shown) so as to receive information such as the shapes of apertures and the layouts of photomasks.

The simulation executing unit 110 designs and provides an optimum aperture according to the layout information of the photomask. The simulation executing unit 110 includes a photolithography simulation unit 111, an aperture flipping unit 113, a cost calculating unit 115, and a cost comparing unit 117.

The photolithography simulation unit 111 realizes a photolithography process, which is to be performed in a projection exposure apparatus, in a virtual space of a computer before an actual process is performed, receives the layout information of the photomask, and predicts the shape of a photoresist pattern which is to be formed on the wafer.

The aperture flipping unit 113 divides the aperture into a plurality of pixels and varies (flips) the open and closed spaces of the pixels in a stepwise manner.

The cost calculating unit 115 calculates a cost function value, which is a difference between the layout information of the photoresist and the photoresist pattern that is formed on the wafer, in the virtual space of the computer. The cost calculating unit 115 calculates the cost function value each time the open and closed spaces of the pixels are varied in a stepwise manner varied by the aperture flipping unit 113.

The cost comparing unit 117 compares a cost function value calculated in the previous step with a cost function value calculated in the present step. In this case, if the present cost function value is almost the same as the cost function calculated in the previous step (i.e., within an acceptable margin of error), the simulation stops. If the present cost-function value is not almost the same as the cost function calculated in the previous step, within an acceptable error range or margin, then the photolithography simulation unit 111, the aperture flipping unit 113, and the cost calculating unit 115 are repeatedly operated until the present cost function value is the same as the previous cost function value, within the margin of error.

The display unit 120 may be, for example, a monitor that displays exposure conditions and the shape of the aperture.

The operation of the simulation system is the same as that described with reference to FIG. 2.

The simulation method and system for designing an aperture may be implemented by a computer software program, and the program may be stored in a computer-readable storage medium. Also, the recording medium may be used in a common digital computer and the program may be executed by a digital computer attached to the exposure apparatus, to more easily carried out the process. Suitable recording media include: a magnetic recording medium such as ROM, a floppy disc, and a hard disc; an optical recording medium such as CD ROM and DVD; and a storing medium such as a carrier wave for transmission via the Internet.

The program stored in the storage medium includes an inputting module to which input data, such as exposure conditions and the layout of the photomask, are inputted, a simulation module which executes the simulation to determine an optimum aperture shape using the input data, and a display module which controls the display of the aperture shape and the exposure conditions.

The simulation module includes: a photolithography simulation submodule which simulates a photolithography process in the virtual space of a computer; an aperture flipping submodule which varies the shape of the aperture; a cost calculating submodule which calculates a cost function value, which is a difference between the layout information of the photomask and the simulated photoresist pattern produced by the simulated photolithography process; and a comparison submodule which compares a cost function value calculated in the previous step with a cost function value calculated in the present step.

The shape of the aperture for the layout of each of photomasks can be designed using these modules.

As described above, using the photolithography simulation program, the aperture can be designed in which optimum resolution and DOF for the layout of each of the photomasks are obtained While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for designing an aperture in an exposure apparatus including a light source, an optical lens group, a photomask, and the aperture, the method comprising:
    receiving layout information of the photomask;
    dividing the aperture into a plurality of pixels; and
    flipping the pixels of the aperture;
    executing a photolithography simulation to produce a simulated photoresist pattern using the layout information of the photomask and the pixels of the aperture; and
    searching for a shape of the aperture which provides an optimum resolution of the simulated photoresist pattern.

2. A simulation method for design of an aperture in an exposure apparatus, the method comprising:
    (a) providing exposure conditions and a layout of a photomask;
    (b) dividing the aperture into a plurality of pixels;
    (c) executing a simulation of a photolithography process to produce a simulated photoresist pattern, using the exposure conditions and the layout of the photomask as input data for the simulation;
    (d) calculating a value of a cost function value as a difference between the simulated photoresist pattern formed in (c) and the layout of the photomask;
    (e) flipping the pixels of the aperture; and
    (f) repeatedly performing (c), (d), and (e) until the cost function is uniform.

3. The method of claim 2, wherein the exposure conditions include at least one of the wavelength of a light source in the exposure apparatus, the intensity of the light source, a numerical aperture (NA) value, and the shape of the aperture.

4. A simulation system for designing an aperture in an exposure apparatus, the system comprising:
    an inputting unit adapted to receive input data including layout information of a photomask;
    a simulation executing unit which produces a simulated photoresist pattern and searches for a shape of an aperture providing an optimum resolution in the simulated photoresist pattern, using the input data provided to the inputting unit; and
    a display unit which displays results of the simulation executing unit.

5. The system of claim 4, wherein the input data further includes at least one of a numerical aperture value, a shape of the aperture, and a type and wavelength of a light source in the exposure apparatus.

6. The system of claim 5, wherein the simulation executing unit comprises:
    a photolithography simulation unit which uses the input data to perform a simulated photolithography process to produce the simulated photoresist pattern;
    an aperture flipping unit which divides the aperture into a plurality of pixels and flips the pixels of the aperture in a stepwise manner;
    a cost calculating unit which calculates a value of a cost function as a difference between the simulated photoresist pattern and a layout of a photomask; and
    a cost comparing unit which determines whether the cost function is uniform.

7. The system of claim 4, wherein the display unit is a monitor.

8. The system of claim 4, wherein searching for a shape of an aperture providing an optimum resolution comprises:
    dividing the aperture into a plurality of pixels; and
    flipping the pixels of the aperture.

9. A computer readable recording medium in which is stored a program for executing a method of designing an aperture in an exposure apparatus, the program comprising:
    an input module adapted to receive input data including layout information of a photomask in the exposure apparatus;
    a simulation module adapted to produce a simulated photoresist pattern and to search for a shape of an aperture providing an optimum resolution for the simulated photoresist pattern; and
    a display module which controls a display of a result of the simulation module.

10. The medium of claim 9, wherein the input data includes at least one of a numerical aperture value, a shape of the aperture, and a type and wavelength of a light source in the exposure apparatus.

11. The medium of claim 9, wherein the simulation module comprises:
   a photolithography simulation submodule which uses the input data to perform a simulated photolithography process to produce the simulated photoresist pattern;
   an aperture flipping submodule which divides the aperture into a plurality of pixels and flips the pixels of the aperture in a stepwise manner;
   a cost calculating submodule which calculates a value of a cost function as a difference between the simulated photoresist pattern and a layout of a photomask; and
   a cost comparing unit which determines whether the cost function is uniform.

12. The computer readable recording medium of claim 9, wherein searching for a shape of an aperture providing an optimum resolution comprises:
   dividing the aperture into a plurality of pixels; and
   flipping the pixels of the aperture.

* * * * *